US005528443A

United States Patent [19]

Itoga et al.

[11] Patent Number: 5,528,443

[45] Date of Patent: Jun. 18, 1996

[54] HYBRID SWITCH USING A ONE-SHOT FIRING PULSE

[75] Inventors: Kazusue Itoga; Junzo Tanaka, both of Kawasaki, Japan

[73] Assignee: Fuji Electric Co., Ltd., Kanagawa, Japan

[21] Appl. No.: 348,931

[22] Filed: Nov. 25, 1994

[30] Foreign Application Priority Data

Nov. 26, 1993 [JP] Japan .................................... 5-295789
Apr. 21, 1994 [JP] Japan .................................... 6-082137

[51] Int. Cl.$^6$ .................................................... H03K 17/00

[52] U.S. Cl. ................................. 361/8; 361/13; 361/115

[58] Field of Search ................................. 361/115, 8, 13, 361/42; 307/136

[56] References Cited

U.S. PATENT DOCUMENTS 3,783,305 1/1974 Lefferts .................................. 307/136

FOREIGN PATENT DOCUMENTS 23 60 564 12/1975 Germany ......................... H01H 9/54
4-354374 8/1992 Japan ............................. H01L 31/12

*Primary Examiner*—Jeffrey A. Gaffin
*Assistant Examiner*—Stephen Jackson
*Attorney, Agent, or Firm*—Finnegan, Henderson, Farabow, Garrett & Dunner

[57] ABSTRACT

Semiconductor switching elements (inverse-parallel connected thyristors) of each main circuit element unit are connected in parallel to a main contact of an electromagnetic contactor. An operation input voltage signal applied to an electromagnetic coil of the electromagnetic contactor is detected by an input-voltage detecting circuit of a control section. When the electromagnetic contactor is closed and opened, a one-shot-pulse generating unit outputs a one-shot pulse based on an output of the input-voltage detecting circuit and a signal indicating an opening/closing state of an auxiliary normally-closed contact of the electromagnetic contactor. The semiconductor switching elements are made on only for a short time by a firing circuit based on the one-shot pulse, to turn on and off a load current.

8 Claims, 9 Drawing Sheets

HYBRID SWITCH USING A ONE-SHOT FIRING PULSE

BACKGROUND OF THE INVENTION

The present invention relates to a hybrid switch which has semiconductor switching elements connected in parallel to a main contact of an electromagnetic contactor used for switching a motor load or the like, and which is adapted to operate the semiconductor switching elements for a short time at the time of the actuation and cutting off of the electromagnetic contactor.

The hybrid switch of this type ensures that no arc is produced between contacts of a mechanical contact, which is a main contact of an electromagnetic contactor, by causing semiconductor switching elements to perform the turning on and off of an energization current during the actuation and cutting off of the electromagnetic contactor.

FIG. 14 is a circuit diagram of a hybrid switch which illustrates a conventional device a patent application for which was filed by the present applicant (Japanese Unexamined Patent Publication No. Hei. 4-354374).

In FIG. 14, reference numeral 51 denotes an a.c. power supply; 52, a load connected to the a.c. power supply 51 via a main contact 53*a* of an electromagnetic contactor 53; 53, the electromagnetic contactor having the main contact 53*a* and an auxiliary normally-closed contact 53*b*; 54, a triac (a semiconductor switching element) connected in parallel to the main contact 53*a* of the electromagnetic contactor 53; and 55, a gate trigger resistor connected in series with the auxiliary normally-closed contact 53*b* of the electromagnetic contactor 53, its connection with the auxiliary normally-closed contact 53*b* being connected to the gate G of the triac 54.

In the hybrid switch shown in FIG. 14, when the electromagnetic contactor 53 is in a cut-off state, the triac 54 remains off since the auxiliary normally-closed contact 53*b* is closed and the circuit between the gate and the cathode is shorted. On application of an operation input voltage signal to the electromagnetic contactor 53, the electromagnetic contactor 53 starts operation, and an unillustrated movable iron core starts to move toward a fixed iron core, whereupon the auxiliary normally-closed contact 53 is opened before the main contact 53*a* is closed, thereby supplying a firing signal to the gate G of the triac 54 via the gate trigger resistor 55 and turning on the triac 54. After the triac 54 is turned on, if the main contact 53*a* of the electromagnetic contactor 53 is closed, most of the load current flowing across the triac 54 flows to the load 52 via the main contact 53*a*. Then, when there is no longer the operation input voltage signal which was applied to the electromagnetic contactor 53, the main contact 53*a* is opened. At this time, since the firing signal is applied to the gate G of the triac 54 via the gate trigger resistor 55, the triac 54 is turned on, and the load current flowing through the main contact 53*a* flows via the triac 54. When the auxiliary normally-closed contact 53*b* is closed after the main contact 53*a* of the electromagnetic contactor 53 is opened, the circuit between the gate and the cathode of the triac 54 is shorted, and the firing signal which was being supplied to the gate G is stopped, so that the triac 54 is turned off at a point of time when the load current from the a.c. power supply 51 passes through the zero point. Thus, when the electromagnetic contactor 53 is actuated and cut off, the triac 54 undergoes an on operation for a short duration, thereby preventing the occurrence of an arc resulting from the closing and opening of the main contact 53*a*. Since it suffices if the triac 54 undergoes the on operation for a short duration to allow the load current to flow, an element of a small capacity for conduction for a short duration is used as the triac 54.

With the conventional device shown in FIG. 14, since the auxiliary normally-closed contact 53*b* is open when the electromagnetic contactor 53 is on, a load current, though small, flows across the gate G of the triac 54. For this reason, if the main contact 53*a* of the electromagnetic contactor 53 undergoes a faulty contact, the load current is applied to the gate G to turn the triac 54 on, causing all the load current to flow across the triac 54. Since the element of a small capacity for conduction for a short duration is used as the triac 54 as described above, if the load current continues to flow due to the faulty contact of the main contact 53*a*, there is the risk of heat being generated, resulting in thermal breakdown. To prevent such thermal breakdown of the triac 54, it is conceivable to use a large-capacity element as the triac 54. In that case, however, it is necessary to provide a cooling member for heat dissipation in the case where the load current continues to flow across the triac 54. In addition to the fact that the large-size triac 54 causes the element itself to be expensive, since the cooling member is required, there are drawbacks in that the hybrid switch becomes expensive and large in size. In the event that the auxiliary normally-closed contact 53*b* undergoes a faulty contact in addition to the faulty contact of the main contact 53*a*, the same drawbacks as those described above are encountered since the load current is constantly supplied to the gate G of the triac 54.

In addition, when the opening and closing of the load 52 is effected at a high frequency, the hybrid switch, particularly the triac 54, undergoes the on operation frequently. For this reason, the electric power occurring in the triac 54 increases, and the amount of heat generated becomes large, so that there is the drawback in that thermal breakdown occurs in a small-capacity triac.

Furthermore, as for the electromagnetic contactor, if the voltage value of the operation input voltage signal is at a prescribed value or higher, sufficient attraction occurs between the fixed iron core and the movable iron core, and complete actuation takes place. On the other hand, if the voltage value of the operation input voltage signal is below the prescribed value, and the operation input voltage signal of a voltage value lower than the specified value is applied, sufficient attraction does not occur between the fixed iron core and the movable iron core, so that the attraction and release of the movable iron core is repeated. Consequently, the main contact 53*a* and the auxiliary normally-closed contact 53*b* of the electromagnetic contactor are repeatedly turned on and off, so that the triac 54 frequently undergoes the on operation. In this case as well, there is the drawback in that thermal breakdown occurs in a small-capacity triac.

SUMMARY OF THE INVENTION

Accordingly, an object of the present invention is to provide an inexpensive hybrid switch which can be made compact, which can prevent the thermal breakdown of the semiconductor switching element even when faulty contact occurs in the main contact or the auxiliary normally-closed contact of the electromagnetic contactor, and in which a small-capacity semiconductor switching element can be used for the electromagnetic contactor which is opened and closed at a high frequency, thereby overcoming the above-described drawbacks of the convention devices.

To attain the above-described object, according to a first aspect of the invention, a hybrid switch which has semiconductor switching elements connected in parallel to a main contact of an electromagnetic contactor and is adapted to operate the semiconductor switching elements for a short time at the time of the actuation and cut-off of the electromagnetic contactor, comprises: a control section for detecting a fall of an auxiliary normally-closed contact signal and a fall of an operation input voltage signal, and for outputting a one-shot pulse at each point of time of detection thereof so as to apply a firing pulse to the semiconductor switching elements.

According to a second aspect of the invention, a hybrid switch which has semiconductor switching elements connected in parallel to a main contact of an electromagnetic contactor and is adapted to operate the semiconductor switching elements for a short time at the time of the actuation and cut-off of the electromagnetic contactor, comprises: a control section for detecting a fall of an auxiliary normally-closed contact signal and a fall of an operation input voltage signal, and for outputting a one-shot pulse at each point of time of detection thereof so as to apply a firing pulse to the semiconductor switching elements; and a voltage monitoring circuit for monitoring an interterminal voltage or a load-side interphase voltage of the main contact of the electromagnetic contactor so as to determine faulty contact of the main contact or faulty conduction of the semiconductor switching elements, wherein the control section prohibits the outputting of the one-shot pulse or turns off an operating coil of the electromagnetic contactor by the output of the voltage monitoring circuit.

Further, according to a third aspect of the invention, a hybrid switch which has semiconductor switching elements connected in parallel to a main contact of an electromagnetic contactor and is adapted to operate the semiconductor switching elements for a short time at the time of the actuation and cut-off of the electromagnetic contactor, comprises: a control section for detecting a fall of an auxiliary normally-closed contact signal and a fall of an operation input voltage signal, and for outputting a one-shot pulse at each point of time of detection thereof so as to apply a firing pulse to the semiconductor switching elements, the control section having a timer which starts a timing operation of a predetermined time limit and issues an output by the output of the one-shot pulse and stops the output upon completion of the timing operation of the predetermined time limit, the outputting of the one-shot pulse being prohibited while the output is being issued from the timer.

Furthermore, according to a fourth aspect of the invention, a hybrid switch which has semiconductor switching elements connected in parallel to a main contact of an electromagnetic contactor and is adapted to operate the semiconductor switching elements for a short time at the time of the actuation and cut-off of the electromagnetic contactor, comprises: a control section for detecting a fall of an auxiliary normally-closed contact signal and a fall of an operation input voltage signal, and for outputting a one-shot pulse at each point of time of detection thereof so as to apply a firing pulse to the semiconductor switching elements; and an input-voltage detecting circuit for issuing an output when a voltage of the operation input voltage signal is equal to or exceeds an operating voltage or a returning voltage of the electromagnetic contactor, wherein the control section issues the one-shot pulse on condition of the output of the input-voltage detecting circuit.

Still further, according to a fifth aspect of the invention, a hybrid switch which has semiconductor switching elements connected in parallel to a main contact of an electromagnetic contactor and is adapted to operate the semiconductor switching elements for a short time at the time of the actuation and cut-off of the electromagnetic contactor, comprises: a control section for detecting a fall of an auxiliary normally-closed contact signal and a fall of an operation input voltage signal, and for outputting a one-shot pulse at each point of time of detection thereof so as to apply a firing pulse to the semiconductor switching elements, wherein the control section detects a rise of the operation input voltage signal, detects the presence or absence of the fall of the auxiliary normally-closed contact signal after the rise, and prohibits the outputting of the one-shot pulse when there is no fall in the auxiliary normally-closed contact signal.

According to the first aspect of the invention, a fall of an auxiliary normally-closed contact signal and a fall of the operation input voltage signal are detected, and a one-shot pulse is outputted at each point of time of detection thereof so as to apply a firing pulse to the semiconductor switching elements. As a result, even if the auxiliary normally-closed contact or the main contact of the electromagnetic contactor undergoes a faulty contact, the semiconductor switching elements are energized only during a period specified by the one-shot pulse, so that the semiconductor switching elements are not subjected to thermal breakdown.

According to the second aspect of the invention, in addition to the constitution according to the first aspect, a voltage monitoring circuit is provided for monitoring an interterminal voltage or a load-side interphase voltage of the main contact of the electromagnetic contactor so as to determine faulty contact of the main contact or faulty conduction of the semiconductor switching elements, and the outputting of the one-shot pulse to the semiconductor switching elements is prohibited by the output of the voltage monitoring circuit, or an operating coil of the electromagnetic contactor is turned off by the output of the voltage monitoring circuit. Even if the main contact undergoes a closing operation after the turning on of the semiconductor switching elements, if the main contact has undergone a faulty contact, the outputting of the one-shot pulse is prohibited by detecting a voltage appearing between the terminals on the main contact after the outputting of the one-shot pulse or detecting that the load-side interphase voltage becomes zero. This narrows the time width of the one-shot pulse and reduce the energization period of the semiconductor switching elements, thereby suppressing the heat generation of the semiconductor switching elements. Also, if the semiconductor switching elements have undergone faulty conductance, on detecting the fact that a voltage appears between the terminals of the main contact during the outputting of the one-shot pulse, the operating coil of the electromagnetic contactor is turned off, thereby releasing the electromagnetic contactor.

According to the third aspect of the invention, in addition to the constitution according to the first aspect, a timer is provided which starts a timing operation of a predetermined time limit and issues an output by the output of the one-shot pulse and stops the output upon completion of the timing operation of the predetermined time limit, and the outputting of the one-shot pulse is prohibited while the output is being issued from the timer. Consequently, even if the electromagnetic contactor is subjected to switching control frequently, the one-shot pulse is not outputted within the time limit of the timer, so that the heat generation by the semiconductor switching elements can be suppressed.

According to the fourth aspect of the invention, in addition to the constitution according to the first aspect, an input-voltage detecting circuit is provided for issuing an output when a voltage of the operation input voltage signal is equal to or exceeds an operating voltage or a returning voltage of the electromagnetic contactor, and the control section issues the one-shot pulse on condition of the output of the input-voltage detecting circuit. Consequently, in cases where the voltage value of the operation input voltage signal is lower than the predetermined value, the semiconductor switching elements do not undergo the on operation, so that the semiconductor switching elements are not subjected to thermal breakdown due to the repetition of the on-operation.

According to the fifth aspect of the invention, in addition to the constitution according to the first aspect, the control section detects the presence or absence of the fall of the auxiliary normally-closed contact signal after a rise of the operation input voltage signal. Accordingly, if the auxiliary normally-closed contact has undergone a faulty contact, the fall in the auxiliary normally-closed contact signal does not occur, so that the faulty contact of the auxiliary normally-closed contact is detected, and the outputting of the one-shot pulse is prohibited.

BRIEF DESCRIPTION OF THE DRAWINGS

FIGS. 3A–3C are waveform diagrams of essential portions explaining the operation of the hybrid switch shown in FIG. 1, in which FIG. 3A is a waveform diagram of the essential portions during the normal operation, FIG. 3B is a waveform diagram of the essential portions during faulty contact of an auxiliary normally-closed contact, and FIG. 3C is a waveform diagram of the essential portions during faulty contact of a main contact;

FIGS. 5A and 5B are waveform diagrams of essential portions explaining the operation of the embodiment shown in FIG. 4, in which FIG. 5A is a waveform diagram of the essential portions during the normal operation, and FIG. 5B is a waveform diagram of the essential portions during faulty contact of a main contact;

FIGS. 9A–9C are waveform diagrams of essential portions explaining the operation of the embodiment shown in FIG. 8, in which FIG. 9A is a waveform diagram of the essential portions during the normal operation, FIG. 9B is a waveform diagram of the essential portions during faulty contact of a main contact, and FIG. 9C is a waveform diagram of the essential portions during faulty conductance of thyristors (switching elements) of main circuit element units;

FIGS. 13A and 13B are waveform diagrams of essential portions explaining the operation of the embodiment shown in FIG. 12, in which FIG. 13A is a waveform diagram of the essential portions during the normal operation, and FIG. 13B is a waveform diagram of the essential portions during faulty contact of the auxiliary normally-closed contact.

DESCRIPTION OF THE PREFERRED EMBODIMENTS

Embodiments of the present invention will be hereinafter described with reference to the accompanying drawings.

Figure 1:
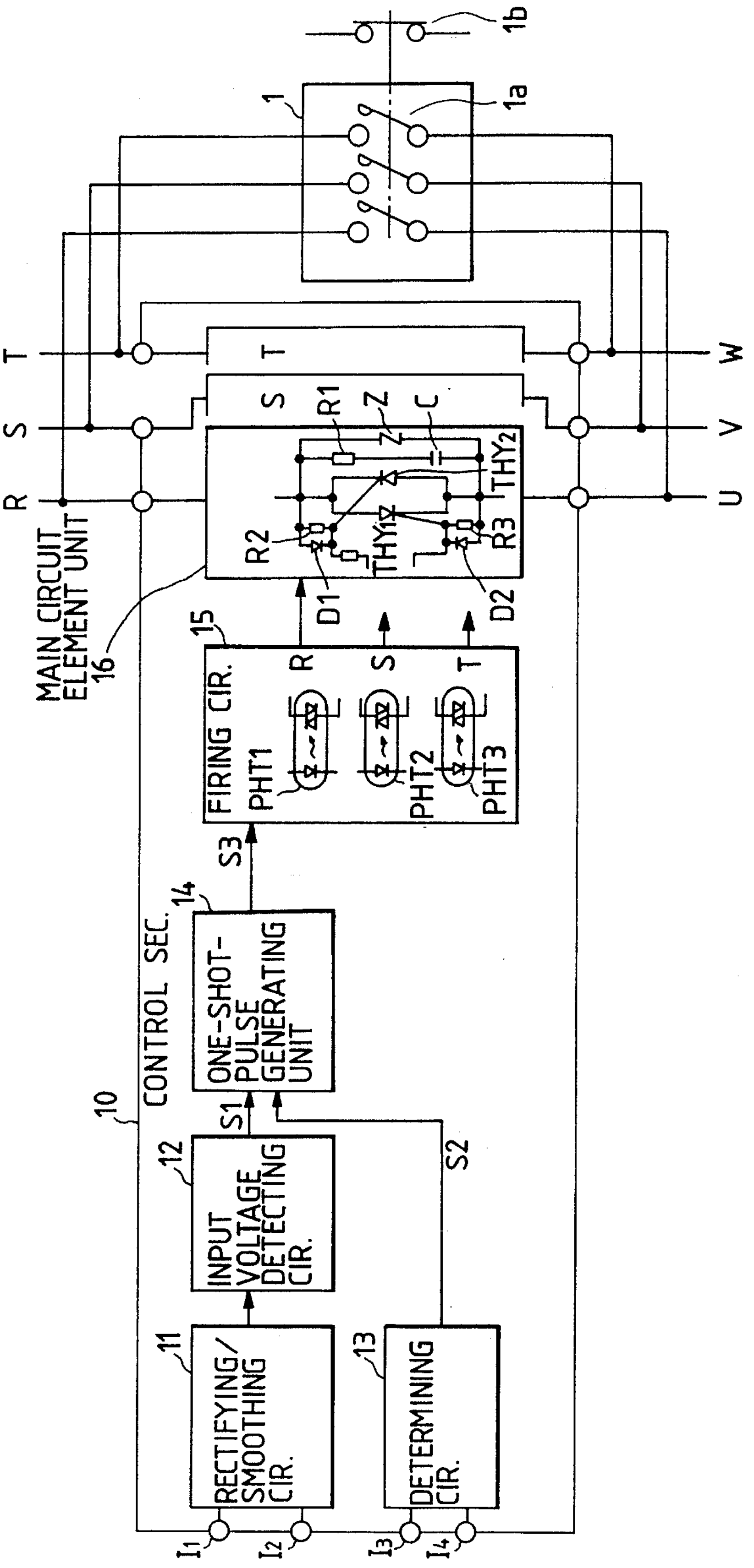
FIG. 1 is a block diagram illustrating a configuration of a hybrid switch in accordance with an embodiment of the present invention.

FIG. 1 is a block diagram of a hybrid switch illustrating an embodiment of the present invention.

In FIG. 1, reference numeral 1 denotes an electromagnetic contactor. This electromagnetic contactor 1 is provided with a main contact 1*a* having one terminal connected to three-phase a.c. power supply terminals R, S, and T and another end connected to load terminals U, V, and W, as well as an auxiliary normally-closed contact 1*b* interlocking with the main contact 1*a*. Numeral 10 denotes a control section for controlling semiconductor switching elements which will be described later. Applied to operation input terminals $I_1$ and $I_2$ of the control section 10 is an operation input voltage signal, which is connected in parallel to an electromagnetic coil (not shown) of the electromagnetic contactor 1 and is applied to the electromagnetic coil. The auxiliary normally-closed contact 1*b* of the electromagnetic contactor 1 is connected to auxiliary-contact input terminals $I_3$ and $I_4$ of the control section 10. The control section 10 is comprised of the following: a rectifying/smoothing circuit 11 connected to the operation input terminals $I_1$ and $I_2$; an input-voltage detecting circuit 12 for detecting whether or not the output voltage of the rectifying/smoothing circuit 11 has reached a specified value of the operating voltage during actuation of the electromagnetic contactor 1 or the returning voltage during a cut-off thereof, the input-voltage detecting circuit 12 being adapted to output (S1) a signal of high level (hereafter, the high-level signal will be referred to as the H signal) when the output voltage of the rectifying/smoothing circuit 11 has reached the specified value, and a signal of low level (hereafter, the low-level signal will be referred to as the L signal) when the output voltage of the rectifying/smoothing circuit 11 has not reached the specified value; a determining circuit 13 connected to the auxiliary-contact input terminals $I_3$ and $I_4$ and adapted to output (S2) the L signal and the H signal in correspondence with the closed state and the open state of the auxiliary normally-closed contact 1*b*; a one-shot-pulse generating unit 14 for outputting a one-shot pulse signal S3 on the basis of signals from the determining circuit 13 and the input-voltage detecting circuit 12; a firing circuit 15 having photocouplers PHT1, PHT2, and PHT3 to which the one-shot pulse from the one-shot-pulse generating unit 14 is supplied; and main circuit element units 16 each having semiconductor switching elements, i.e., two inverse-parallel connected thyristors $THY_1$ and $THY_2$ in this embodiment. The firing circuit 15 includes the photocoupler PHT1 for the R phase, the photocoupler PHT2 for the S phase, and the photocoupler PHT3 for the T phase in correspondence with the three-phase a.c. power supply. The main circuit element units 16 are constituted by three main circuit element units for the R phase, the S phase, and the T phase which are connected between the three-phase a.c. power supply terminals R, S, and T and the load terminals U, V, and W, respectively. Since the configuration for each phase is identical, the main circuit element unit for the R phase is typically illustrated. In the main circuit element unit 16, opposite terminals of the inverse-parallel connected thyristors $THY_1$ and $THY_2$ are connected to the three-phase power supply terminal R and the load terminal U, respectively. A noise filter constituted by a series circuit including a resistor R1 and a capacitor C, as well as a nonlinear element Z called a Z RAP (trademark), are connected to the opposite terminals of the thyristors $THY_1$ and $THY_2$. A parallel circuit constituted by a reverse-flow preventing diode D2 and a resistor R3 is connected between the gate and cathode of the thyristor $THY_1$, while a parallel circuit constituted by a reverse-flow preventing diode D1 and a resistor R2 is connected between the gate and cathode of the thyristor $THY_2$. The respective cathodes of the reverse-flow preventing diodes D1 and D2 are connected to both terminals of the photo triac output of the photocoupler PHT1 of the firing circuit 15. Incidentally, although the case of the thyristor is shown as the semiconductor switching element, a semiconductor element such as a triac may be used instead of the thyristor.

Figure 2:
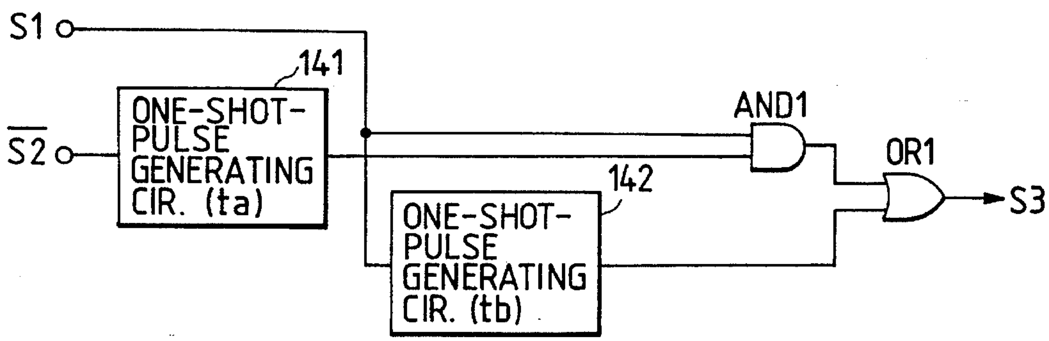
FIG. 2 is a circuit diagram illustrating a configuration of a one-shot-pulse generating unit shown in FIG. 1.

FIG. 2 shows a circuit diagram of the one-shot-pulse generating unit 14 shown in FIG. 1. In FIG. 2, an inverted signal of the normally-closed contact signal S2 from the determining circuit 13 is inputted to a one-shot-pulse generating circuit 141, and this one-shot-pulse generating circuit 141 outputs a one-shot pulse of a time width ta when the normally-closed contact signal S2 has fallen from H to L, i.e., when the auxiliary normally-closed contact 1*b* has changed from the closed state to the open state. Meanwhile, the operation signal S1 corresponding to the operation input voltage signal is inputted to a one-shot-pulse generating circuit 142, and the one-shot-pulse generating circuit 142 outputs a one-shot pulse of a time width tb when the operation signal S1 has fallen from H to L, i.e., when the operation input voltage signal has changed from the on state to the off state. The output of the one-shot-pulse generating circuit 141, together with the operation signal S1, is inputted to an AND circuit AND1. When the AND condition of the AND circuit AND1 holds, i.e., when the inverted signal of the contact signal S2 has changed from H (the auxiliary normally-closed contact 1*b* is in the closed state) to L (the auxiliary normally-closed contact 1*b* is in the open state) when the operation signal S1 is H, and the one-shot pulse of the time width ta has been outputted, the AND condition holds, and the one-shot pulse signal S3 of the time width ta is outputted to the firing circuit 15 via an OR circuit OR1. When the one-shot pulse of the time width tb is outputted from the one-shot-pulse generating circuit 142, the one-shot pulse S3 of the time width tb is outputted to the firing circuit 15 via the OR circuit OR1.

Namely, at the time of the actuation of the electromagnetic contactor 1, when the operation signal S1 (corresponding to the operation input voltage signal) is in the on state, and when the auxiliary normally-closed contact 1*b* has changed from the closed state to the open state, the AND condition of the AND circuit AND1 holds, and the signal S3 is outputted. Meanwhile, at the time of the cutting off of the electromagnetic contactor 1, when the operation signal S1 has changed from on to off, the signal S3 is outputted.

Figure 3A:
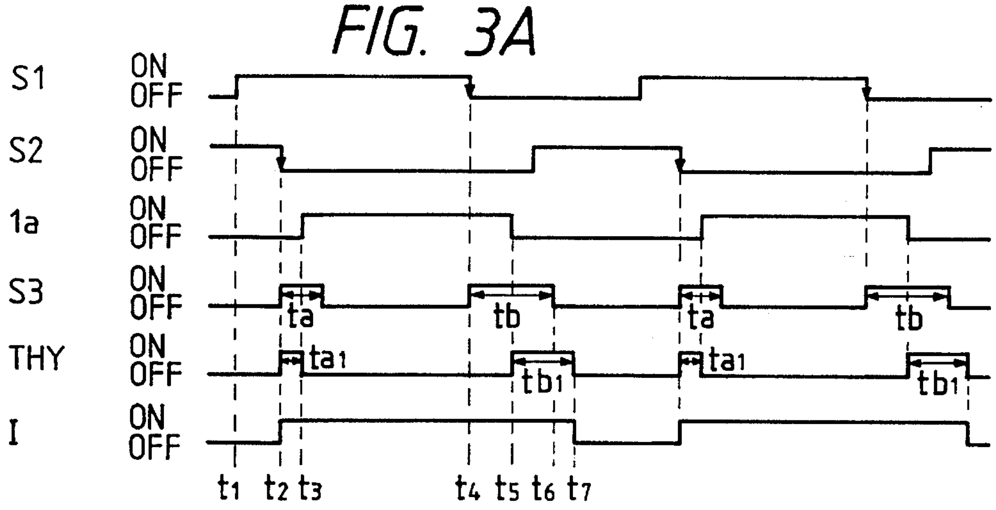
Figure 3B:
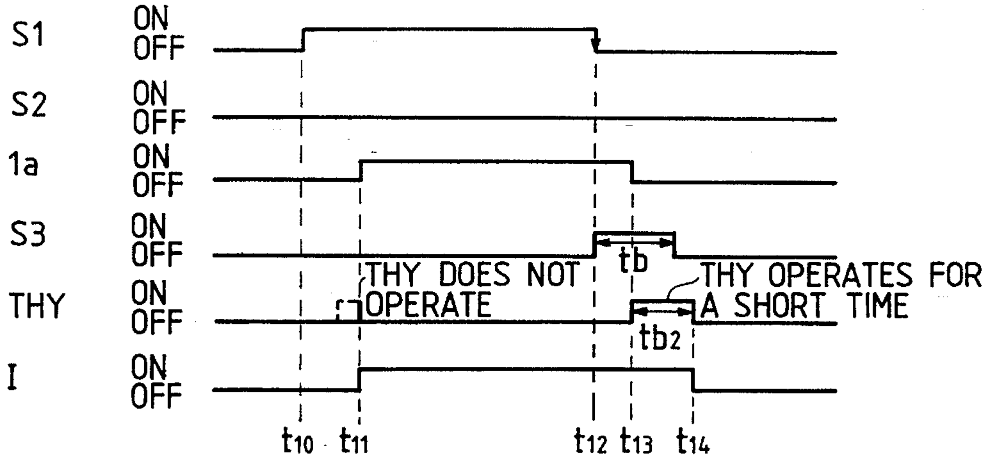
Figure 3C:
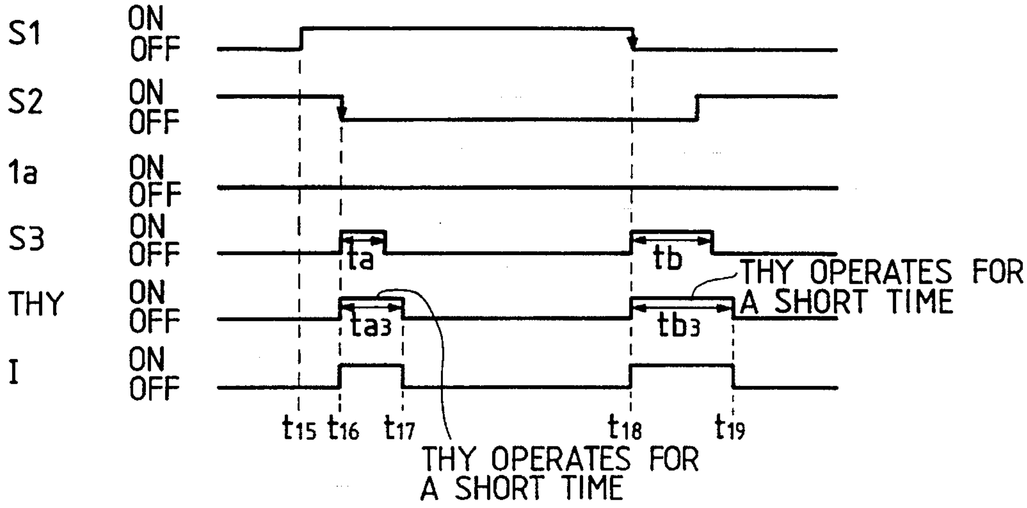

Next, the operation in accordance with the embodiment shown in FIG. 1 will be described with reference to the waveform diagrams shown in FIG. 3. In FIG. 3, S1 denotes the output of the input-voltage detecting circuit 12; S2 denotes the normally-closed contact signal indicating the on and off states of the auxiliary normally-closed contact 1*b*; 1*a* denotes the main contact signal indicating the on and off states of the main contact 1*a* of the electromagnetic contactor 1; S3 denotes the output signal from the one-shot-pulse generating unit 14; THY denotes the operation signal of the thyristors THY1 and THY2 of each main circuit element unit 16; and I denotes the load current. FIG. 3A is a waveform diagram of various parts during the normal operation, FIG. 3B is a waveform diagram of the various parts during faulty contact of the auxiliary normally-closed contact, and FIG. 3C is a waveform diagram of the various parts during faulty contact of the main contact. Incidentally, the waveform diagrams during faulty contact shown in FIGS. 3B and 3C are illustrated with time intervals increased with respect to the waveform diagram during the normal operation shown in FIG. 3A, so as to facilitate an understanding.

First, during the normal operation shown in FIG. 3A, the operation input voltage signal is applied to the operation input terminals $I_1$ and $I_2$ of the control section 10, and it is assumed that the output signal S1 outputted from the input-voltage detecting circuit 12 is turned on at a timing $t_1$ when the operation input voltage signal has reached a specified value. At the same time, a voltage is applied to the electromagnetic coil of the electromagnetic contactor 1, causing the movable iron core to be attracted by the fixed iron core. Then, if it is assumed that the auxiliary normally-closed contact 1*b* is opened at a timing $t_2$ before the main contact 1*a* is closed, since the operation input voltage signal S1 is on, and the auxiliary normally-closed contact 1*b* changes to the open state, i.e., the signal at the auxiliary normally-closed contact 1*b* falls from on to off, the one-shot pulse S3 of the time width ta is outputted from the one-shot-pulse generating unit 14. If a firing signal is applied to the thyristors of the main circuit element units 16 via the firing circuit 15 by means of this one-shot pulse S3, the thyristors are turned on, allowing a load current to be supplied to the load via the thyristors. If the main contact 1*a* of he electromagnetic contactor 1 is closed at a timing $t_3$, the load current flows across that main contact 1*a*, the thyristors of the main circuit element units 16 are turned on for a short duration $ta_1$ from the timing $t_2$ until the timing $t_3$, and are then turned off. The one-shot pulse outputted from the one-shot-pulse generating unit 14 at the timing $t_2$ is turned off after the lapse of a time duration ta. Thus, during the actuation of the electromagnetic contactor 1, after the thyristors of the main circuit element units 16 are turned on for a short duration to energize the load, the main contact 1*a* of the electromagnetic contactor 1 is closed, thereby changing over the load current from the thyristors to the main contact 1*a*.

After the actuation of the electromagnetic contactor 1, if the operation input voltage signal is cut off at a timing $t_4$, the one-shot pulse S3 of the time width tb is outputted from the one-shot-pulse generating unit 14. By means of this one-shot pulse from the one-shot-pulse generating unit 14, the firing signal is applied to the thyristors of the main circuit element units 16 from the firing circuit 15 to set the thyristors in a conductible state. However, since the main contact 1*a* of the electromagnetic contactor 1 is on, the thyristors are not turned on immediately. At the same time as the main contact 1*a* of the electromagnetic contactor 1 is turned off at a timing $t_5$, the thyristors of the main circuit element units 16 are turned on, thereby changing over the load current from the main contact 1*a* to the thyristors. If the one-shot pulse outputted from the one-shot-pulse generating unit 14 at the timing $t_4$ is turned off after the lapse of a time duration tb from the timing $t_4$, the thyristors of the main circuit element units 16 are turned off at a timing $t_7$ when the a.c. current of the three-phase a.c. power supply finally passes through the zero point. Thus, during the cutting off of the electromagnetic contactor 1, the load current is cut off by the thyristors of the main circuit element units 16 which are turned on for a short duration $tb_1$ from the timing $t_5$ until the timing $t_7$.

Next, referring to the waveform diagram shown in the FIG. 3B, a description will be given of the operation in the case where the auxiliary normally-closed contact 1*b* has undergone a faulty contact.

In this case, even if the operation input voltage signal S1 is inputted at a timing $t_{10}$, and a voltage is applied to the electromagnetic coil of the electromagnetic contactor 1 to cause the movable iron core to be attracted by the fixed iron core, the auxiliary normally-closed contact 1*b* remains in the off state due to the faulty contact. For this reason, the one-shot pulse is not outputted from the one-shot-pulse generating unit 14, and the firing signal is not applied to the thyristors of the main circuit element units 16 from the firing circuit 15, so that the thyristors are not turned on and remain in the off state. After application of the operation input voltage signal S1 at the timing $t_{10}$, the electromagnetic contactor 1 closes the main contact 1*a* at a timing $t_{11}$, thereby allowing the load current to flow. Then, when the operation input voltage signal S1 is cut off at a timing $t_{12}$, and the operation input voltage signal S1 falls from on to off, the one-shot pulse of the time width tb is outputted from the one-shot-pulse generating unit 14, thereby setting the thyristors in a conductible state. If the main contact 1*a* is turned off at a timing $t_{13}$ after the cutting-off of the operation input voltage signal S1, the load current is changed over from the main contact 1*a* to the thyristors, and flows across the thyristors. These thyristors are turned off at a point of time when the a.c. current of the three-phase a.c. power supply passes through the zero point as the one-shot pulse S3 is turned off after the lapse of the time duration tb from the timing $t_{12}$. The thyristors are then turned on briefly for a duration $tb_2$ from the timing $t_{13}$ when the main contact 1*a* was turned off until a timing $t_{14}$. Thus, in cases where the auxiliary normally-closed contact 1*b* has undergone a faulty contact, the thyristors are not turned on during the actuation of the electromagnetic contactor 1, and the thyristors are turned on only for a short time at the time of the cutting off of the electromagnetic contactor 1, so that the thyristors are not subjected to breakdown.

Next, referring to the waveform diagram shown in FIG. 3C, a description will be given of the operation in the case where the main contact 1*a* has undergone a faulty contact.

In this case, after the operation input voltage signal S1 is inputted at a timing $t_{15}$, and a voltage is applied to the electromagnetic coil of the electromagnetic contactor 1 to cause the movable iron core to be attracted by the fixed iron core, the signal at the auxiliary normally-closed contact 1*b* falls from on to off at a timing $t_{16}$. Consequently, the one-shot pulse of the time width ta is outputted from the one-shot-pulse generating unit 14, and a firing signal is applied to the thyristors of the main circuit element units 16 via the firing circuit 15, thereby turning the thyristors on. As the thyristors are turned on, the load current begins to flow. However, since after the lapse of the time duration ta of the one-shot pulse S3 from the timing $t_{16}$, the thyristors are turned off at a timing $t_{17}$ when the a.c. current finally passes through the zero point, so that the load current flows only during the on period (with a time width $ta_3$) of the thyristors. On the other hand, when the operation input voltage signal S1 is cut off at a timing $t_{18}$, the one-shot pulse of the time width tb is outputted from the one-shot-pulse generating unit 14, so that the thyristors are turned on, allowing the load current to flow. After the lapse of the time duration tb of the one-shot pulse S3 from the timing $t_{18}$, the thyristors are turned off at a timing $t_{19}$ when the a.c. current passes through the zero point, with the result that the load current is cut off, and the load current flows only during the on period (with a time width $tb_3$) of the thyristors. Thus, in cases where the main contact 1*a* has undergone a faulty contact, at the time of the actuation and cutting off of the electromagnetic contactor 1, the thyristors of the main circuit element units 16 are turned on for a short duration to allow the load current to flow. However, since the time duration when the load current flows is short, the respective thyristors are not subjected to thermal breakdown.

In the embodiment shown in FIG. 1, the time widths ta and tb of the one-shot pulses which are necessary for firing the thyristors $THY_1$ and $THY_2$ of the main circuit element units 16 must satisfy the following conditions: 1) (the time width ta of the one-shot pulse for actuation)>(operating time of the main contact 1*a*) (operating time of the auxiliary normally-closed contact 1*b*), and 2) (the time width tb of the one-shot pulse for cut-off)>(returning time of the auxiliary normally-closed contact 1*b*). Consequently, during the normal operation, the on period of each of the thyristors $THY_1$ and $THY_2$ during the faulty contact of the auxiliary normally-closed contact 1*b* and during the faulty contact of the main contact 1*a* becomes as follows: First, (a) during the normal operation, 1) (the on period $ta_1$ of each thyristor for actuation)=(operating time of the main contact 1*a*) (operating time of the auxiliary normally-closed contact 1*b*), and 2) (the on period $tb_1$ of each thyristor for cut-off)≦[(returning time of the auxiliary normally-closed contact 1*b*) (returning time of the main contact 1*a*)]+(½ cycle of the a.c. power supply). (b) During the faulty contact of the auxiliary normally-closed contact 1*b*, 1) (the on period $ta_2$ of each thyristor for actuation)=0, and 2) (the on period $tb_2$ of each thyristor for cut-off)≦[(time width tb of the one-shot pulse) (returning time of the main contact 1*a*)]+(½ cycle of the a.c. power supply). (c) During the faulty contact of the main contact 1*a*, 1) (the on period $ta_3$ of each thyristor for actuation)≦(time width ta of the one-shot pulse)+(½ cycle of the a.c. power supply), and 2) (the on period $tb_3$ of each thyristor for cut-off)≦(time width tb of the one-shot pulse)+(½ cycle of the a.c. power supply). Through (a) to (c), the on period of each thyristor for actuation becomes such that $ta_1 < ta_3$, while the on period of each thyristor for cut-off becomes such that $tb_1 < tb_2 < tb_3$; therefore, a semiconductor element of a capacity capable of withstanding energization for $ta_3$ or $tb_3$ needs to be selected as each thyristor. Generally, since the relationship $ta < tb$ holds, $ta_3 < tb_3$, so that a semiconductor element of a capacity capable of withstanding energization for a short duration of $tb_3$ is selected as each thyristor.

Figure 4:
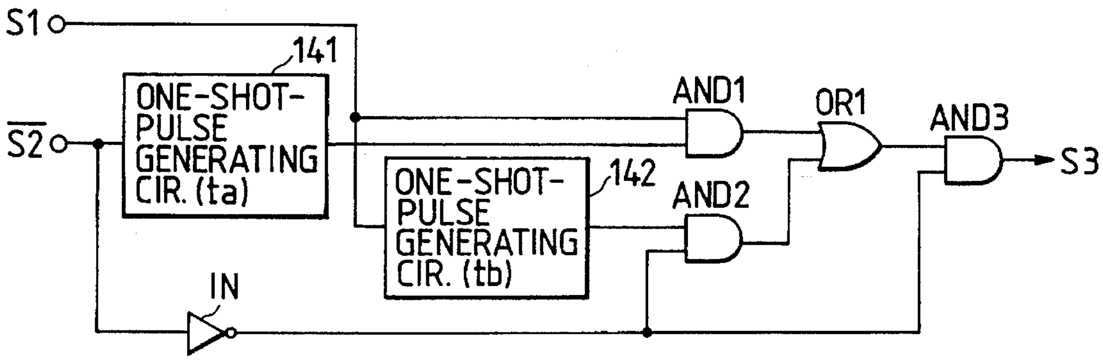
FIG. 4 is a circuit diagram illustrating an embodiment having a one-shot-pulse generating unit different from that shown in FIG. 1.

For the above-described reason, in order to make the semiconductor element compact, it suffices if the on period tb of each thyristor at the time of the cutting off of the electromagnetic contactor 1 is made short. Referring now to FIG. 4, a description will be given of an embodiment in which the on period of each thyristor is made shorter than in the embodiment shown in FIG. 1. FIG. 4 is a circuit diagram illustrating an embodiment in which the one-shot-pulse generating unit 14 is different from the one shown in FIGS. 1 and 2, and since the other configurations are identical to those shown in FIG. 1, a description thereof will be omitted.

The embodiment shown in FIG. 4 differs from the one shown in FIG. 2 in the following: The output of the one-shot-pulse generating circuit 141, together with the operation signal S1, is inputted to the AND circuit AND1. When the AND condition of the AND circuit AND1 holds, i.e., when the inverted signal of the normally-closed contact signal S2 has changed from H (the auxiliary normally-closed contact 1*b* is in the closed state) to L (the auxiliary normally-closed contact 1*b* is in the open state) when the operation signal S1 is H, and the one-shot pulse of the time width ta has been outputted, the AND condition holds, and the one-shot pulse signal of the time width ta is outputted via the OR circuit OR1. The output of the one-shot-pulse generating circuit 142, together with a signal obtained by inverting the inverted signal of the normally-closed contact signal S2 by an inverter IN, is inputted to an AND circuit AND2. When the AND condition of the AND circuit AND2 holds, i.e., when the inverted signal of the normally-closed contact signal S2 is L (the auxiliary normally-closed contact 1*b* is in the open state) and the one-shot pulse of the time width tb has been outputted, the AND condition holds, and the one-shot pulse of the time width tb is outputted via the OR circuit OR1. The output of this OR circuit OR1, together with a signal obtained by inverting the inverted signal of the normally-closed contact signal S2 by the inverter IN, is inputted to an AND circuit AND3. The one-shot pulse signal S3 is outputted to the firing circuit 15 from this AND circuit AND3.

Figure 5A:
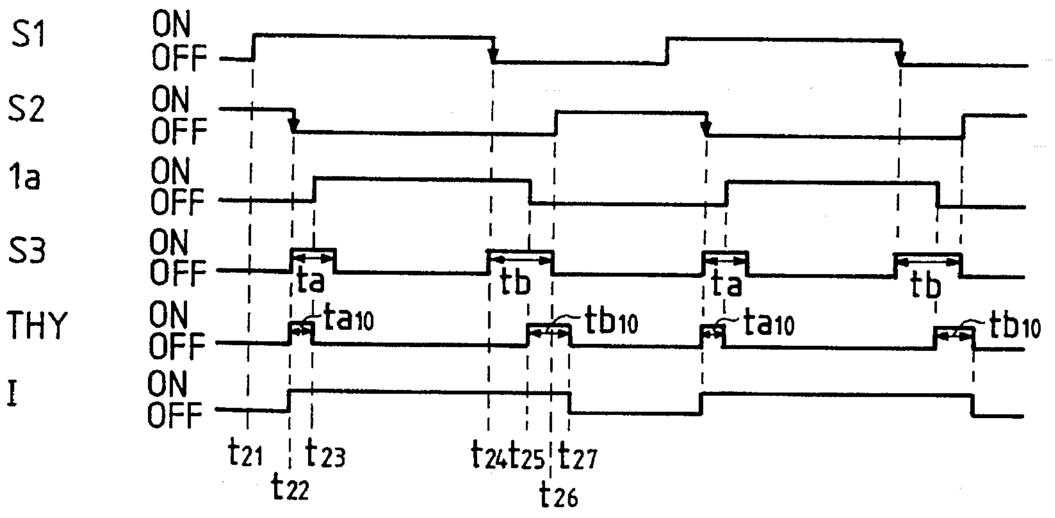
Figure 5B:
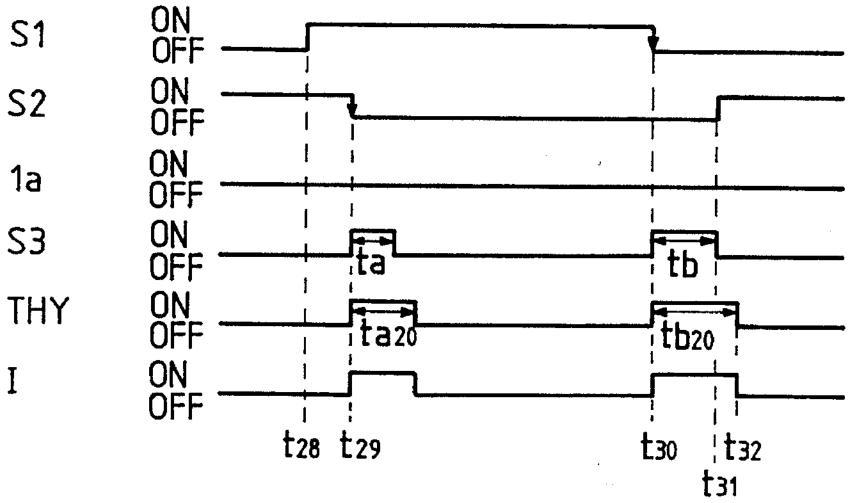

The operation in accordance with this embodiment will be described with reference to the operating waveform diagrams shown in FIGS. 5A and 5B. FIG. 5A shows a waveform diagram during the normal operation, while FIG. 5B shows a waveform diagram during the faulty contact of the main contact. First, during the normal operation shown in FIG. 5A, after the operation input voltage signal S1 is applied at a timing $t_{21}$ at the time of actuation of the electromagnetic contactor 1, the signal at the auxiliary normally-closed contact 1*b* falls from on to off at a timing $t_{22}$, whereupon the one-shot pulse of the time width ta is outputted from the one-shot-pulse generating circuit 141, while the H signal is applied to the other input terminal of the AND circuit AND3 via the AND circuit AND1 and the OR circuit OR1. Since the H signal obtained by inverting the inverted signal (L signal) of the auxiliary normally-closed contact 1*b* by the inverter IN is applied to one input terminal of the AND circuit AND3, the one-shot pulse of the time width ta is outputted from the AND circuit AND3, so that the thyristors are turned on, thereby allowing the load current to flow. When the main contact 1*a* of the electromagnetic contactor 1 is turned on, the load current flows via the main contact, so that each thyristor is turned off at a timing $t_{23}$, and the energization period of each thyristor becomes $ta_{10}$. When the operation input voltage signal is cut off at a timing $t_{24}$, the one-shot pulse of the time width tb is outputted from the one-shot-pulse generating circuit 142 shown in FIG. 4. Since the auxiliary normally-closed contact 1*b* is in the open state and the output of the inverter IN is H, the AND circuit AND2 conducts, and the H signal is applied to the other input terminal of the AND circuit AND3 via the OR circuit OR1. Since the H signal from the inverter IN is applied to one input terminal of this AND circuit AND3, the AND circuit AND3 conducts, so that the one-shot pulse of the time width tb is outputted, thereby setting the thyristors in a conductible state. Then, when the main contact 1*a* is opened at a timing $t_{25}$, the thyristors are turned on to allow the load current to flow. When the auxiliary normally-closed contact 1*b* is subsequently closed at a timing $t_{26}$, the input of the inverter IN shown in FIG. 4 becomes H, and the output of the inverter IN becomes L, so that the AND circuit AND3 does not conduct, and the output of the one-shot pulse tb is cut off at this timing $t_{26}$. The thyristors are turned off at a timing $t_{27}$ when the a.c. current passes through the zero point after the cutting-off of the one-shot pulse at the timing $t_{26}$, and its energization period becomes $tb_{10}$. Next, during the faulty contact of the main contact 1*a* shown in FIG. 5B, after the operation input voltage signal S1 is applied at a timing $t_{28}$, the signal at the auxiliary normally-closed contact 1*b* falls from on to off at a timing $t_{29}$, whereupon the one-shot pulse of the time width ta is outputted from the one-shot-pulse generating circuit 141 in the same way as during the normal operation, and the thyristors are turned on to allow the load current to flow. The thyristors are then turned off when the a.c. current finally passes through the zero point after the turning off of the one-shot pulse of the time width ta. At the same time as the operation input voltage signal is cut off at a timing $t_{30}$, the one-shot pulse of the time width tb is generated, and the thyristors are turned on to allow the load current to flow. When the auxiliary normally-closed contact 1*b* is closed at a timing $t_{31}$, the AND circuit AND3 shown in FIG. 4 does not conduct, so that the one-shot pulse is cut off. Then, at a timing $t_{32}$ when the first a.c. current subsequently flows through the zero point, the thyristors are turned off, cutting off the load current. In this case, the energization period of each thyristor becomes $tb_{20}$. Thus, in the embodiment shown in FIG. 4, the on period of each thyristor at the time of the cutting off of the electromagnetic contactor 1 becomes the period from the on timing of the one-shot pulse until the first a.c. current passes through the zero point after the closing of the auxiliary normally-closed contact 1*b*. As such, it is possible to shorten the on period of each thyristor in contrast to a configuration in which the on period of each thyristor is determined by the time width of the one-shot pulse as in the embodiment shown in FIG. 2.

Figure 6:
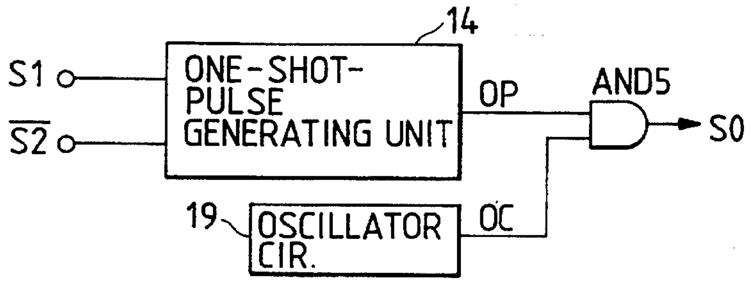
FIG. 6 is a circuit diagram of the one-shot-pulse generating unit illustrating an embodiment different from the one shown in FIG. 1.
Figure 7:
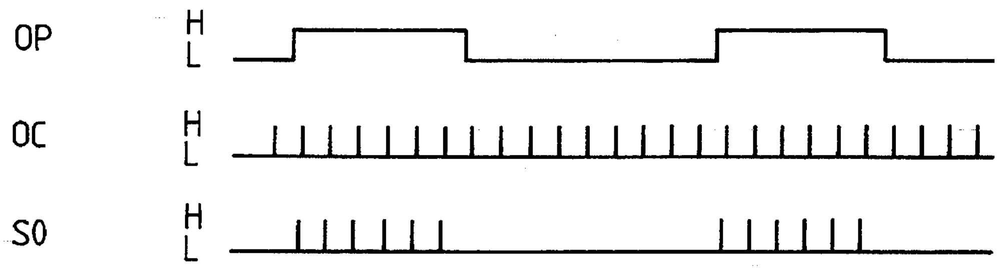
FIG. 7 is a waveform diagram of essential portions explaining the operation of the embodiment shown in FIG. 6.

FIG. 6 illustrates an embodiment in which the one-shot-pulse generating unit 14 is different from the one shown in FIGS. 1 and 2, and the other configurations are identical to those shown in FIG. 1. The embodiment shown in FIG. 6 differs from the one shown in FIGS. 1 and 2 in the following: An oscillator circuit 19 is provided in addition to the one-shot-pulse generating unit 14 shown in FIG. 1, and the outputs of the oscillator circuit 19 and the one-shot-pulse generating unit 14 are inputted to an AND circuit AND5 to obtain an AND. The operation of the circuit diagram shown in FIG. 6 is illustrated in FIG. 7. As shown in FIG. 7, a firing command SO obtained by an AND of an output OP of the one-shot-pulse generating unit 14 and an oscillation output OS of the oscillator circuit 19 becomes an intermittent pulse signal, so that the firing command SO is capable of reducing the amount of heat generated from the circuit elements and reducing the power consumption. Since the operation at the time of the actuation and cutting off of the electromagnetic contactor 1 is identical to the one shown in FIG. 1, a description thereof will be omitted.

Figure 8:
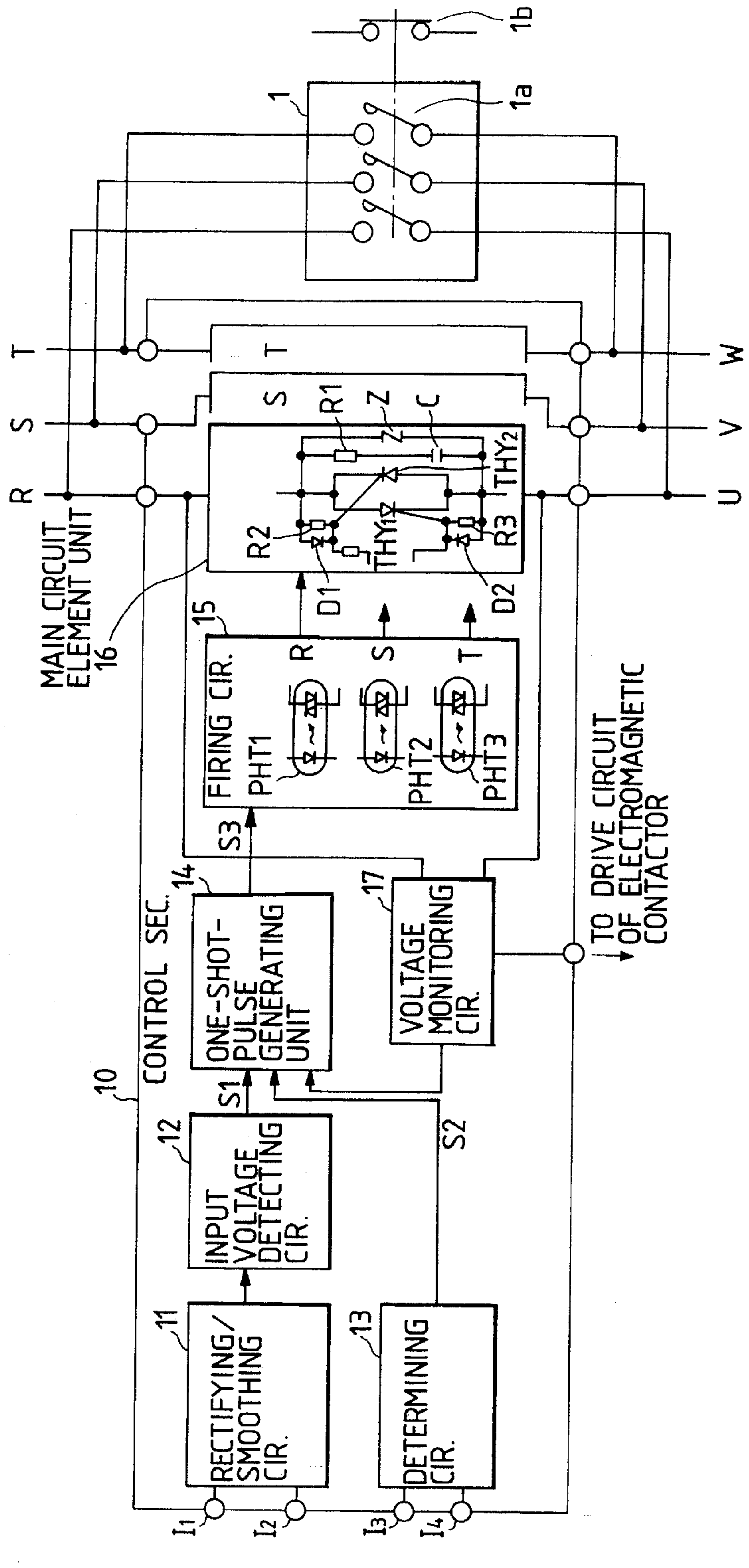
FIG. 8 is a block diagram illustrating a configuration of a hybrid switch in accordance with still another embodiment of the present invention.
Figure 9A:
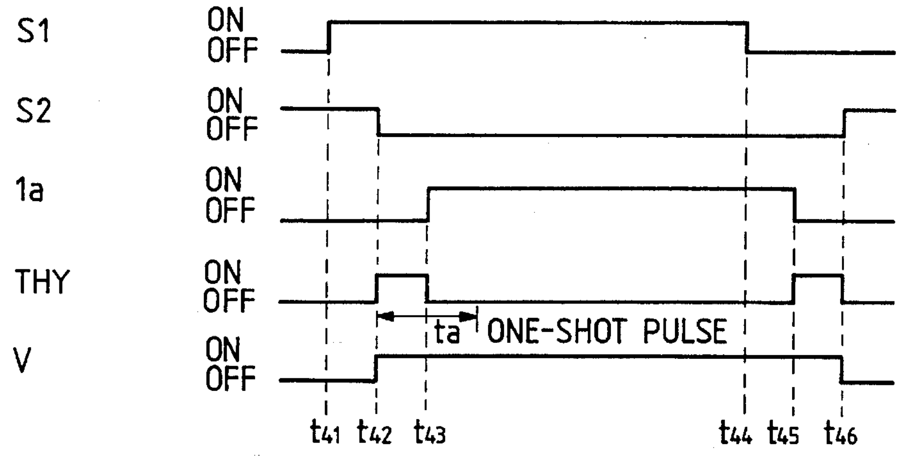

FIG. 8 is a block diagram of a hybrid switch illustrating another embodiment of the invention. Component parts or portions which are identical to those shown in FIG. 1 will be denoted by the same reference numerals, and a description thereof will be omitted. The embodiment shown in FIG. 8 differs from the one shown in FIG. 1 in the following: A voltage monitoring circuit 17, which is connected to opposite terminals of the main contact 1*a* of the electromagnetic contactor 1, is provided to detect an interterminal voltage at the main contact, and an output of the voltage monitoring circuit 17 is inputted to the one-shot-pulse generating unit 14, so as to obtain an AND of the operation input voltage signal S1 and the normally-closed contact signal S2 from the determining circuit 13 for determining the state of the auxiliary normally-closed contact 1*b*. Furthermore, the output of the voltage monitoring circuit 17 is inputted to an unillustrated drive circuit of the electromagnetic contactor 1, so as to turn off the operating coil of the electromagnetic contactor 1. The operation of this embodiment will be described with reference to the waveform diagrams shown in FIG. 9. In FIG. 9, S1 denotes the output of the input-voltage detecting circuit 12; S2 denotes the normally-closed contact signal; 1*a* denotes the main contact signal; THY denotes the operation signal of the thyristors THY1 and THY2 of the main circuit element units 16; and V denotes an interterminal-voltage monitoring output of the voltage monitoring circuit 17. FIG. 9A is a waveform diagram of various parts during the normal operation, FIG. 9B is a waveform diagram of the various parts during faulty contact of the auxiliary normally-closed contact, and FIG. 9C is a waveform diagram of the various parts during faulty conductance of the main circuit element units.

First, during the normal operation shown in the FIG. 9A, when the operation input voltage signal S1 is turned on at a timing $t_{41}$, the auxiliary normally-closed contact 1*b* is closed at a timing $t_{42}$, and the one-shot pulse of the time width ta is outputted from the one-shot-pulse generating unit 14, so that the thyristors of the main circuit element units 16 are turned on, allowing the load current to flow. As the thyristors of the main circuit element units 16 are turned on, the interterminal voltage at the main contact 1*a* becomes substantially zero, so that the interterminal-voltage monitoring output V is set in the on state. Then, the main contact 1*a* is closed at a timing $t_{43}$, but since the interterminal voltage at the main contact 1*a* is substantially zero, the interterminal-voltage monitoring output V continues to be on. When the operation input voltage signal S1 is cut off at a timing $t_{44}$, the main contact 1*a* is turned off at a timing $t_{45}$, and the thyristors of the main circuit element units 16 are turned on, while the auxiliary normally-closed contact 1*b* is closed at a timing $t_{46}$, and the thyristors of the main circuit element units 16 are turned off. The interterminal-voltage monitoring output V is set in the off state.

Figure 9B:
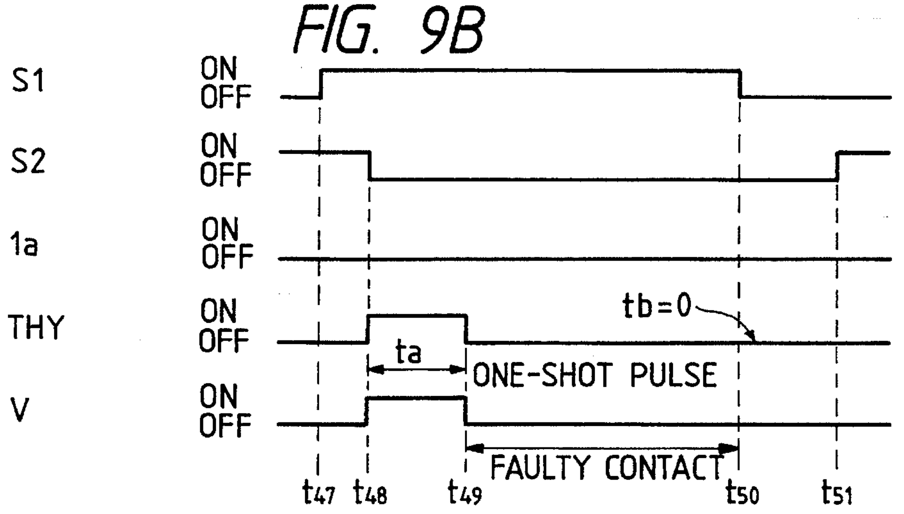

Next, during the faulty contact of the main contact shown in FIG. 9B, when the one-shot pulse of the time width ta is outputted at a timing $t_{48}$ to turn on the thyristors of the main circuit element units 16, and this one-shot pulse disappears at a timing $t_{49}$, if the main contact 1*a* has undergone a faulty contact, a voltage is generated between the terminals of the main contact 1*a*. When the voltage generated between the terminals of the main contact 1*a* is detected by the voltage monitoring circuit 17 after the outputting of the one-shot pulse, the voltage monitoring circuit 17 applies to the one-shot-pulse generating unit 14 an output prohibit command with the interterminal-voltage monitoring output V off, so as to prohibit the outputting of the one-shot pulse subsequent to that point of time and prevent the thyristors from being fired. By virtue of the adoption of such a configuration, during the faulty contact of the main contact 1*a*, it is possible to prohibit the outputting of the one-shot pulse after the thyristors are turned on only once by the initial one-shot pulse after the application of the operation input voltage signal, so that the time width ta of the one-shot pulse can be set such that ta=tb=0. Hence, the capacity of each thyristor can be made small. It should be noted that although a description has been given of the voltage monitoring circuit 17 which is arranged to monitor the voltage between the terminals of the main contact 1*a*, the voltage monitoring circuit 17 may monitor the line voltage on the load side of the main contact 1*a*.

Figure 9C:
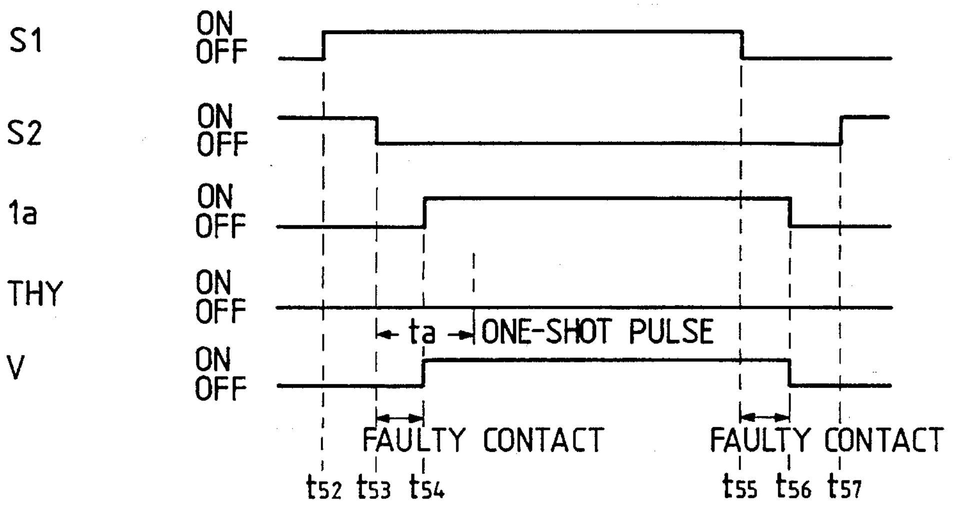

Furthermore, during the faulty conductance of the main circuit element units 16 shown in FIG. 9C, since the thyristors of the main circuit element units 16 are not turned on even if the one-shot pulse of the time width ta is outputted at a timing $t_{53}$, a voltage is generated between the terminals of the main contact 1*a* until the main contact 1*a* is turned on at a timing $t_{54}$. When the voltage occurring between the terminals of the main contact 1*a* is detected by the voltage monitoring circuit 17 while the one-shot pulse is being outputted, the voltage monitoring circuit 17 outputs a cut-off command with an interterminal-voltage monitoring output off to an unillustrated drive circuit of the electromagnetic contactor 1, so as to turn off the operating coil of the electromagnetic contactor 1 and release it.

Figure 10:
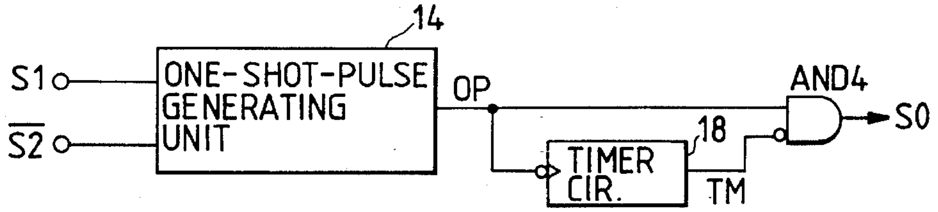
FIG. 10 is a block diagram illustrating a configuration of a hybrid switch in accordance with a further embodiment of the present invention.
Figure 11:
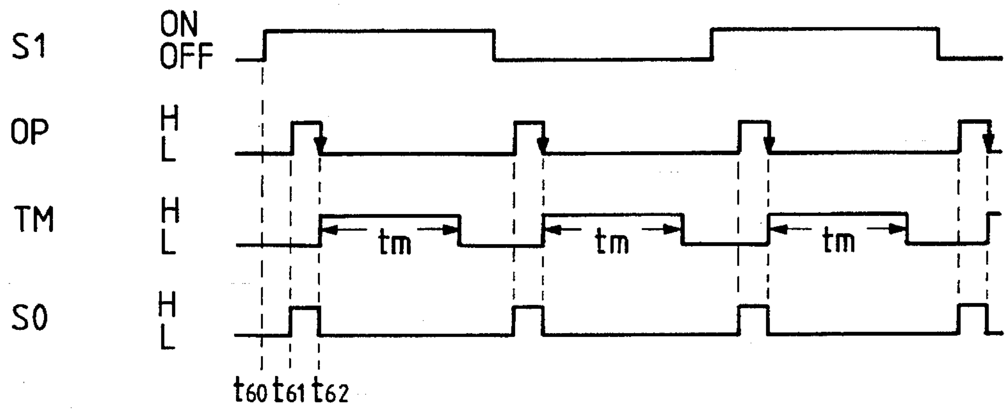
FIG. 11 is a waveform diagram of essential portions explaining the operation of the embodiment shown in FIG. 10.

Next, another embodiment of the invention will be described with reference to FIG. 10. In FIG. 10, only the aspects which differ from the embodiment of the invention shown in FIG. 1 are shown, and since the other configurations are identical to those shown in FIG. 1, a description thereof will be omitted. The embodiment of the invention shown in FIG. 10 differs from the one shown in FIG. 1 in the following: The output OP of the one-shot-pulse generating unit 14 is used as one input of an AND circuit AND4, and is inputted to a timer circuit 18, and an output TM of the timer circuit 18 is used as another input of the AND circuit AND4. The time limit of the timer circuit 18 is set to be greater than the time width of the one-shot pulse. The operation of this embodiment shown in FIG. 10 will be described with reference to the waveform shown in FIG. 11. After the operation input voltage signal S1 is applied at a timing $t_{60}$ shown in FIG. 11 to open the unillustrated auxiliary normally-closed contact, the one-shot pulse is outputted at a timing $t_{61}$, whereupon a firing signal is outputted to the thyristors from the AND circuit AND4 since the H signal obtained by inverting the L signal of the timer circuit 18 is applied to another input terminal of the AND circuit AND4. When the one-shot pulse is turned off at a timing $t_{62}$, the input of the timer circuit 18 falls from on to off, so that the timer circuit 18 starts the timing operation. When the output TM of the timer circuit 18 becomes H, the input to the AND circuit AND4 becomes L, so that the AND circuit AND4 does not conduct, causing the firing signal SO to each thyristor to disappear. During the timing operation of the timer circuit 18, since the other input to the AND circuit AND4 is L, the timer circuit 18 continues to remain nonconductive. After the lapse of a time limit tm of the timer circuit 18, a time limit signal is outputted from the timer circuit 18, thereby setting the AND circuit AND4 in a nonconductive state. Thus, in the embodiment shown in FIG. 10, the arrangement provided is such that the timer circuit 18 starts the timing operation at a falling timing of the one-shot pulse, and the firing signal SO is not applied to each thyristor during this timing period. Accordingly, even if high-frequency switching is carried out in such a manner as to open and close the electromagnetic contactor 1 at shorter time intervals than the time limit tm of the timer circuit, the thyristors are not turned on on each such occasion. As a result, by setting the time limit of the timer circuit 18 in accordance with the heat capacity of each thyristor, it is possible to prevent the thermal breakdown of the thyristors.

Another embodiment of the invention lies in the input-voltage detecting circuit 12 which is shown in FIG. 1 that illustrates the first embodiment. In the embodiment shown in FIG. 1, the input-voltage detecting circuit 12 is not required in cases where the power supply for supplying the operation input voltage signal is stable. In cases where the power supply for supplying the operation input voltage signal is instable, however, the input-voltage detecting circuit 12 is provided, and an arrangement is provided such that an output is provided by the use of the input-voltage detecting circuit 12 when the voltage of the operation input voltage signal is equal to or exceeds the operating voltage or returning voltage of the electromagnetic contactor 1. By virtue of the adoption of such an arrangement, it is possible to prevent a situation in which, when the voltage of the operation input voltage signal has not reached a specified value sufficient to attract the movable iron core of the electromagnetic contactor 1 toward the fixed iron core, the movable iron core is not attracted positively by the fixed iron core, and the on-off operation of the auxiliary normally-closed contact is repeated due to the repetition of the attraction and release of the movable iron core, causing the thyristors to undergo a frequent on-off operation and resulting in the thermal breakdown of the thyristors.

Figure 12:
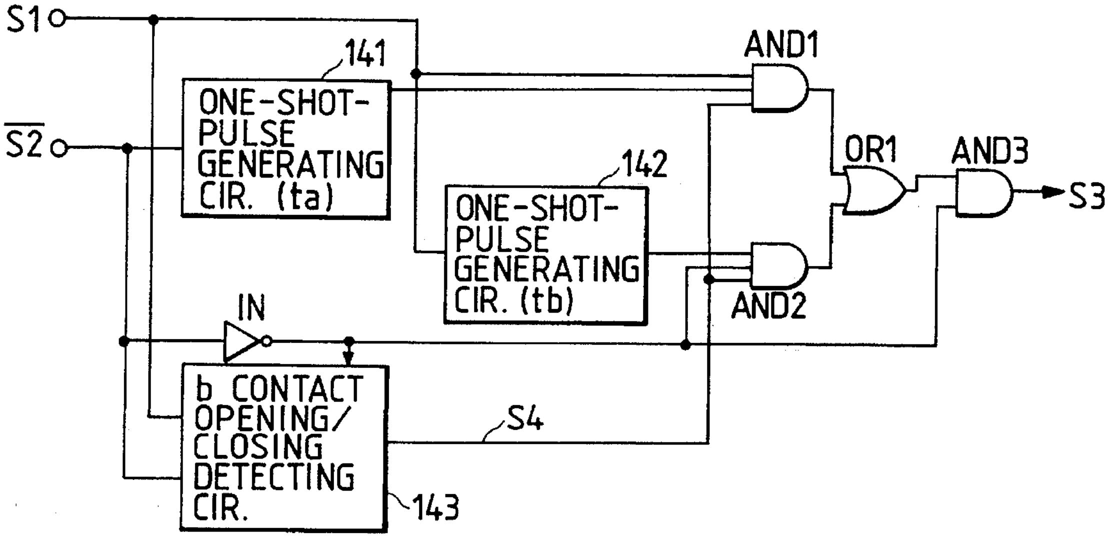
FIG. 12 is a block diagram illustrating a configuration of a hybrid switch in accordance with a still further embodiment of the present invention.
Figure 14:
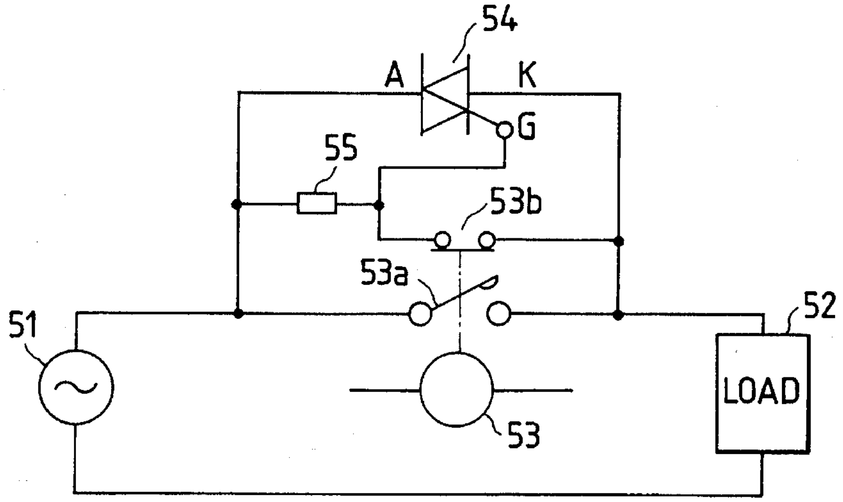
FIG. 14 PRIOR ART
FIG. 14 is a circuit diagram illustrating a hybrid switch of a conventional device.

FIG. 12 shows still another embodiment using the one-shot-pulse generating unit 14 which is different from the one shown in FIG. 4, and the other configurations are identical to those shown in FIG. 1. The embodiment shown in FIG. 12 differs from the one shown in FIG. 4 in that there is provided a b contact opening/closing detecting circuit 143 to which the operation signal S1, the inverted signal of the normally-closed contact signal S2, and the output of the inverter IN are inputted, an output signal S4 of the b contact opening/closing detecting circuit 143 being inputted to input terminals of the AND circuits AND1 and AND2. During the normal operation of the auxiliary normally-closed contact 1*b*, since the normally-closed contact signal S2 is turned off after the operation signal S1 is turned on, the b contact opening/closing detecting circuit 143 determines whether a faulty contact has occurred in the auxiliary normally-closed contact 1*b* on the basis of whether or not the normally-closed contact signal is turned off during the on period of the operation signal S1. The b contact opening/closing detecting circuit 143 stores the result of detection in a self-holding circuit and, in case of a faulty contact, outputs an off signal indicating an abnormality. This self-holding circuit is reset by a rise of the output of the inverter IN.

Figure 13A:
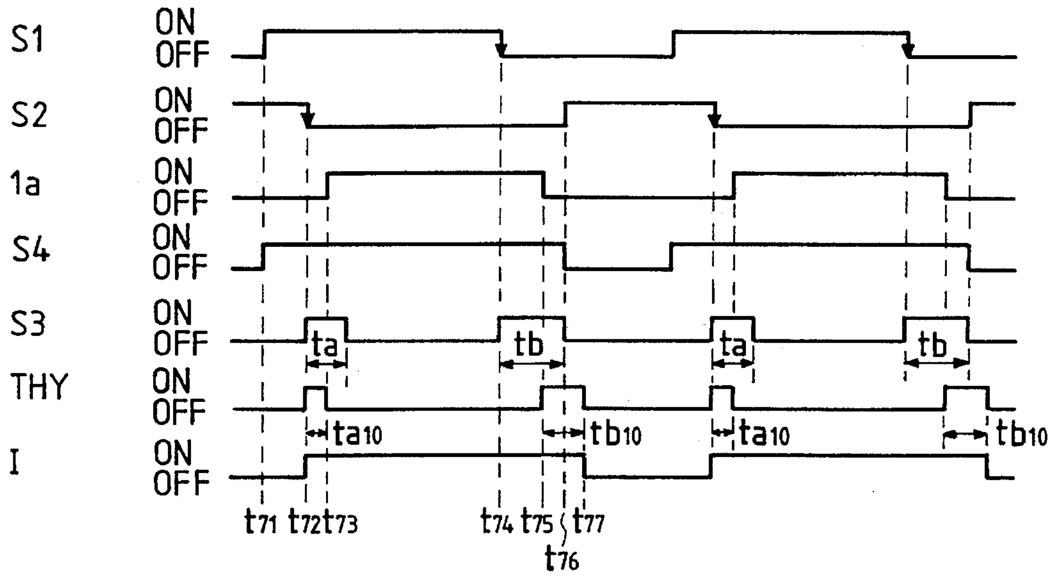
Figure 13B:
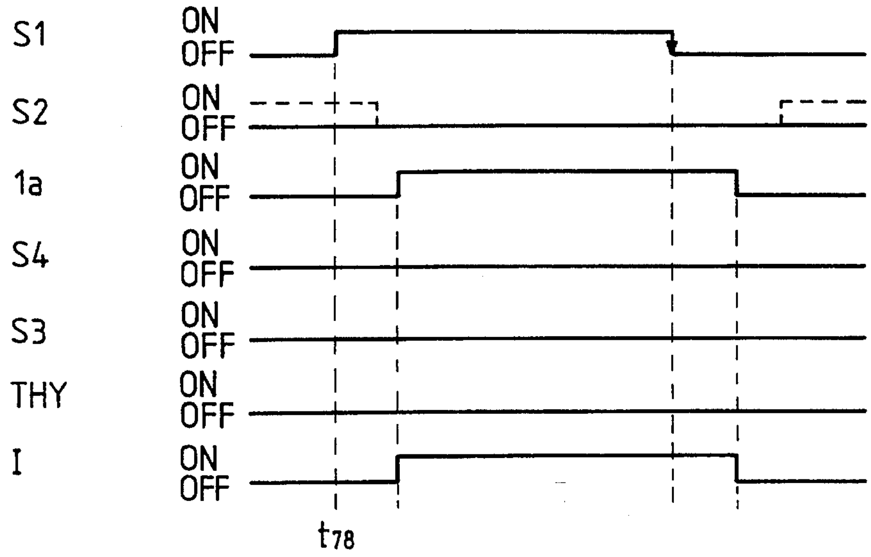

The operation of this embodiment will be described with reference to the operating waveform diagrams shown in FIGS. 13A and 13B. FIG. 13A shows a waveform diagram during the normal operation, and the FIG. 13B shows a waveform diagram during faulty contact of the auxiliary normally-closed contact 1*b*. First, during the normal operation shown in the FIG. 13A, since this operation is similar to the operation shown in FIG. 5A, only differences will be described. The output S4 of the b contact opening/closing detecting circuit 143 is turned on when the operation signal S1 is turned on at a timing $t_{71}$, and the output S4 of the b contact opening/closing detecting circuit 143 is turned off when the normally-closed contact signal S2 is turned on at a timing $t_{76}$, so that the output S4 of the b contact opening/closing detecting circuit 143 does not affect the operation of the AND circuits AND1 and AND2 during the normal operation. Next, during the faulty contact of the auxiliary normally-closed contact 1*b*, since the output S4 of the output S4 of the b contact opening/closing detecting circuit 143 is off, the AND condition of the AND circuits AND1 and AND2 does not hold, with the result that the output of the one-shot pulse signal S3 is stopped. Accordingly, even if the operation input signal S1 is turned on at a timing $t_{78}$, the one-shot pulse S3 of the time width ta is not outputted, so that the thyristors of the main circuit element units 16 are not turned on.

In the embodiments shown in FIGS. 1 and 4, if the auxiliary normally-closed contact 1*b* undergoes a faulty contact, at the time of actuation of the electromagnetic contactor 1, since the normally-closed contact signal S2 is off, the one-shot pulse S3 of the time width ta is not outputted. At the time of cut-off, however, the thyristors of the main circuit element units 16 are turned on since the one-shot pulse S3 of the time width tb is outputted. Accordingly, if high-frequency switching is effected, the loss in the on state of the thyristors becomes large during the cut-off, so that there is the risk of resulting in a breakage incident. However, such an incident can be avoided by providing the b contact opening/closing detecting circuit 143 as in this embodiment. Incidentally, a faulty contact of the auxiliary normally-closed contact is coped with separately.

As described above, according to the first aspect of the invention, a hybrid switch which has semiconductor switching elements connected in parallel to a main contact of an electromagnetic contactor and is adapted to operate the semiconductor switching elements for a short time at the time of the actuation and cut-off of the electromagnetic contactor, comprises: a control section for detecting a fall of an auxiliary normally-closed contact signal and a fall of an operation input voltage signal, and for outputting a one-shot pulse at each point of time of detection thereof so as to apply a firing pulse to the semiconductor switching elements. Consequently, since the firing signal is applied to the semiconductor switching elements only during the period of the one-shot pulse, even if a faulty contact occurs in the main contact or the auxiliary normally-closed contact of the electromagnetic contactor, the semiconductor switching elements are energized only during a short time. Hence, it is possible to provide an inexpensive hybrid switch which does not undergo thermal breakdown even if the capacity of the semiconductor switching elements is made small.

According to the second aspect of the invention, a hybrid switch which has semiconductor switching elements connected in parallel to a main contact of an electromagnetic contactor and is adapted to operate the semiconductor switching elements for a short time at the time of the actuation and cut-off of the electromagnetic contactor, comprises: a control section for detecting a fall of an auxiliary normally-closed contact signal and a fall of an operation input voltage signal, and for outputting a one-shot pulse at each point of time of detection thereof so as to apply a firing pulse to the semiconductor switching elements; and a voltage monitoring circuit for monitoring an interterminal voltage or a load-side interphase voltage of the main contact of the electromagnetic contactor so as to determine faulty contact of the main contact or faulty conduction of the semiconductor switching elements, wherein the control section prohibits the outputting of the one-shot pulse or turns off an operating coil of the electromagnetic contactor by the output of the voltage monitoring circuit. Accordingly, in the event that the main contact of the electromagnetic contactor has undergone a faulty contact, the energization of the semiconductor switching elements is prohibited, so that it is possible to use semiconductor switching elements whose heat capacity is even smaller than in the constitution according to the first aspect. On the other hand, in the event that the semiconductor switching elements have undergone faulty conduction, the operating coil of the electromagnetic contactor is turned off, thereby releasing the electromagnetic contactor.

Further, according to the third aspect of the invention, a hybrid switch which has semiconductor switching elements connected in parallel to a main contact of an electromagnetic contactor and is adapted to operate the semiconductor switching elements for a short time at the time of the actuation and cut-off of the electromagnetic contactor, comprises: a control section for detecting a fall of an auxiliary normally-closed contact signal and a fall of an operation input voltage signal, and for outputting a one-shot pulse at each point of time of detection thereof so as to apply a firing pulse to the semiconductor switching elements, the control section having a timer which starts a timing operation of a predetermined time limit and issues an output by the output of the one-shot pulse and stops the output upon completion of the timing operation of the predetermined time limit, the outputting of the one-shot pulse being prohibited while the output is being issued from the timer. As such, even if the electromagnetic contactor is switched with a high frequency, since the semiconductor switching elements are not energized on each such occasion, there is an advantage in that the heat capacity of the semiconductor switching elements can be made small.

Furthermore, according to the fourth aspect of the invention, a hybrid switch which has semiconductor switching elements connected in parallel to a main contact of an electromagnetic contactor and is adapted to operate the semiconductor switching elements for a short time at the time of the actuation and cut-off of the electromagnetic contactor, comprising: a control section for detecting a fall of an auxiliary normally-closed contact signal and a fall of an operation input voltage signal, and for outputting a one-shot pulse at each point of time of detection thereof so as to apply a firing pulse to the semiconductor switching elements; and an input-voltage detecting circuit for issuing an output when a voltage of the operation input voltage signal is equal to or exceeds an operating voltage or a returning voltage of the electromagnetic contactor, wherein the control section issues the one-shot pulse on condition of the output of the input-voltage detecting circuit. Accordingly, in cases where the voltage value of the operation input voltage signal is lower than a predetermined value, it is possible to obviate a situation in which the main contact of the electromagnetic contactor flutters and the semiconductor switching elements are energized frequently. Hence, there is an advantage in that the heat capacity of the semiconductor switching elements can be made small.

Still further, according to the fifth aspect of the invention, a hybrid switch which has semiconductor switching elements connected in parallel to a main contact of an electromagnetic contactor and is adapted to operate the semiconductor switching elements for a short time at the time of the actuation and cut-off of the electromagnetic contactor, comprises: a control section for detecting a fall of an auxiliary normally-closed contact signal and a fall of an operation input voltage signal, and for outputting a one-shot pulse at each point of time of detection thereof so as to apply a firing pulse to the semiconductor switching elements, wherein the control section detects a rise of the operation input voltage signal, detects the presence or absence of the fall of the auxiliary normally-closed contact signal after the rise, and prohibits the outputting of the one-shot pulse when there is no fall in the auxiliary normally-closed contact signal. As a result, if a faulty contact occurs in the auxiliary normally-closed contact of the electromagnetic contactor, the outputting of the one-shot pulse is prohibited, so that it is possible to prevent causing damage to the semiconductor switching elements particularly in high-frequency switching.

What is claimed is:

1. A hybrid switch comprising:

an electromagnetic contactor having a main contact and an auxiliary normally-closed contact;

a semiconductor switching element connected in parallel to the main contact; and a control section for rendering the semiconductor switching element in an on-state for a short time when the electromagnetic contactor is closed and opened, said control section comprising:

a rectifying/smoothing means for detecting an operation input voltage and generating an output voltage signal;

means for detecting a fall of an auxiliary contact signal indicating an opening/closing state of the auxiliary normally-closed contact;

operation input voltage detecting means, connected to the rectifying/smoothing means, for detecting a fall of the operation input voltage signal, and outputting a high-level signal when the output voltage of the rectifying/smoothing means reaches a specified value or outputting a low-level signal when the output voltage of the rectifying/smoothing means has not reached the specified value; and means for producing a one-shot pulse as a firing pulse for the semiconductor switching element upon the detection of the fall of the auxiliary contact signal or the fall of the operation input voltage signal.

2. The hybrid switch according to claim 1, wherein the one-shot pulses produced at the fall of the auxiliary contact signal or the fall of the operation input voltage signal have different widths.

3. The hybrid switch according to claim 1, wherein the one-shot pulse produced at the fall of the operation input voltage signal falls in response to a rise of the auxiliary contact signal.

4. The hybrid switch according to claim 1, wherein said control section further comprises an oscillator, and wherein the one-shot pulse and an output of the oscillator are ANDed to produce the firing pulse.

5. The hybrid switch according to claim 1, wherein said control section further comprises a voltage monitoring circuit for monitoring an interterminal voltage or a load-side interphase voltage of the main contact of the electromagnetic contactor to determine if there is a faulty contact of the main contact or a faulty conduction of the semiconductor switching element, and wherein the control section prohibits output of the one-shot pulse or turns off an operating coil of the electromagnetic contactor based on an output of the voltage monitoring circuit.

6. The hybrid switch according to claim 1, wherein said control section further comprises a timer for producing an output for a predetermined time in response to output of the one-shot pulse, and wherein the control section prohibits output of a further one-shot pulse while the timer produces the output.

7. The hybrid switch according to claim 1, wherein the operation input voltage detecting means produces an output when the operation input voltage signal is equal to or larger than an operating voltage or a returning voltage of the electromagnetic contactor, and wherein the control section produces the one-shot pulse only while the operation input voltage detecting means produces the output.

8. The hybrid switch according to claim 1, wherein said control section detects a rise of the operation input voltage signal, and then determines a presence of the fall of the auxiliary contact signal, and wherein the control section prohibits output of the one-shot pulse if the fall of the auxiliary contact signal is absent.

* * * * *